(12) United States Patent
Lee et al.

(10) Patent No.: US 8,760,229 B2
(45) Date of Patent: Jun. 24, 2014

(54) SWITCHING AMPLIFIER AND AUDIO DEVICE

(75) Inventors: Jae-cheol Lee, Yongin-si (KR); Hae-jong Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 35 days.

(21) Appl. No.: 13/526,885

(22) Filed: Jun. 19, 2012

(65) Prior Publication Data

US 2013/0033318 A1 Feb. 7, 2013

(30) Foreign Application Priority Data

Aug. 1, 2011 (KR) ........................ 10-2011-0076695

(51) Int. Cl.
*H03F 3/217* (2006.01)
(52) U.S. Cl.
USPC ........................................ 330/251; 330/207 A
(58) Field of Classification Search
USPC ............................ 330/251, 207 A, 295, 124 R
See application file for complete search history.

(56) References Cited

U.S. PATENT DOCUMENTS

| | | | |
|---|---|---|---|
| 6,300,829 B1* | 10/2001 | Luu | 330/251 |
| 8,004,360 B2* | 8/2011 | Zhang et al. | 330/251 |
| 8,283,979 B2* | 10/2012 | Stanley | 330/251 |
| 8,427,235 B2* | 4/2013 | Williams | 330/251 |
| 8,433,078 B2* | 4/2013 | Chee | 381/94.5 |
| 2002/0125941 A1 | 9/2002 | Nguyen | |
| 2003/0067348 A1 | 4/2003 | Butler | |
| 2008/0297248 A1 | 12/2008 | Honda | |
| 2010/0163950 A1 | 7/2010 | Gladish et al. | |

FOREIGN PATENT DOCUMENTS

KR 10-2010-0003253 A 1/2010

OTHER PUBLICATIONS

International Search Report (PCT/ISA/210), dated Nov. 29, 2012, issued by the International Searching Authority in counterpart International Patent Application No. PCT/KR2012/003072.
Written Opinion (PCT/ISA/237), dated Nov. 29, 2012, issued by the International Searching Authority in counterpart International Patent Application No. PCT/KR2012/003072.

* cited by examiner

*Primary Examiner* — Henry Choe
(74) *Attorney, Agent, or Firm* — Sughrue Mion, PLLC

(57) ABSTRACT

A switching amplifier is provided. The switching amplifier includes an input unit which receives an audio signal; a first switching device and a second switching device which switch and output the audio signal; a first snubber circuit which is commonly connected to the first and second switching devices and which reduces overshoot of the audio signal that is output by the first and second switching devices via switching; and a second snubber circuit which is commonly connected to the first and second switching devices, which is connected in parallel to the first snubber circuit and which reduces the overshoot of the audio signal, wherein the first and second snubber circuits alternately reduce the overshoot of the audio signal.

16 Claims, 6 Drawing Sheets

SWITCHING AMPLIFIER AND AUDIO DEVICE

CROSS-REFERENCE TO RELATED APPLICATIONS

This application claims priority under 35 U.S.C. §119 from Korean Patent Application No. 10-2011-0076695, filed on Aug. 1, 2011, in the Korean Intellectual Property Office, the disclosure of which is incorporated herein by reference in its entirety.

BACKGROUND

1. Field

Apparatuses and methods consistent with the present general inventive concept relate to providing a switching amplifier and an audio device, and more particularly, providing a switching amplifier and an audio device which are capable of removing overshoot.

2. Description of the Related Art

Audio devices are devices for outputting audio signals that are recorded as electrical signals, and are equipped with amplifiers that amplify audio signals.

The amplifiers use transistors to amplify audio signals, and thus may cause overshoot at a time of switching between two transistors.

Since overshoot deteriorates the performance of the amplifiers, there is a need to design an amplifier capable of removing overshoot.

SUMMARY

Exemplary embodiments address at least the above problems and/or disadvantages and other disadvantages not described above. Also, the exemplary embodiments are not required to overcome the disadvantages described above, and an exemplary embodiment may not overcome any of the problems described above.

The exemplary embodiments provide a switching amplifier and an audio device which are capable of removing overshoot in an amplifier.

According to an aspect of the exemplary embodiments, there is provided a switching amplifier including an input unit which receives an audio signal; first and second switching devices which switch and output the audio signal; a first snubber circuit which is commonly connected to the first and second switching devices and reduces overshoot of the audio signal that is output by the first and second switching devices via switching; and a second snubber circuit which is commonly connected to the first and second switching devices, is connected in parallel to the first snubber circuit and reduces the overshoot of the audio signal, wherein the first and second snubber circuits alternately reduce the overshoot of the audio signal.

The input unit may include a buffer which delays the audio signal and outputs the delayed audio signal; and an inverter which inverts the audio signal and outputs the inverted audio signal, wherein the first switching device is a field-effect transistor (FET) has a gate to which an output port of the buffer is connected, a drain to which a first power supply unit and a first end of the first snubber circuit are commonly connected, and a source to which a second end of the first snubber circuit, a drain of the second switching device, and a first end of the second snubber circuit are commonly connected.

The second switching device may be an FET having a gate to which an output port of the inverter is connected, a drain to which the source of the first switching device, a second end of the first snubber circuit, and a first end of the second snubber circuit are commonly connected, and a source to which a second power supply unit a second end of the second snubber circuit are commonly connected.

The first snubber circuit may include a first resistor and a first capacitor which are connected in series, wherein the first resistor has a first end to which the first capacitor is connected and a second end to which a second end of the first switching device and a first end of the second switching device are commonly connected and the first capacitor has a first end to which a first power supply unit and a first end of the first switching device are commonly connected and a second end to which the first resistor is connected.

The second snubber circuit may include a second resistor and a second capacitor which are connected in series, wherein the second resistor has a first end to which the second end of the first switching device and the first end of the second switching device are commonly connected, and a second end to which the second capacitor is connected and the second capacitor has a first end to which the second resistor is connected and a second end to which the second power supply unit and the second end of the second switching device are commonly connected.

The switching amplifier may also include an LC circuit which is commonly connected to the first and second switching devices.

According to another aspect of the exemplary embodiments, there is provided an audio device including a communication interface unit which receives audio content; an audio processing unit which separates the audio content into a plurality of audio signals; and a plurality of switching amplifiers which switch the audio signals using two switching devices connected thereto in series and provide the switched audio signals to a plurality of speakers, wherein each of the switching amplifiers includes two snubber circuits which are connected in parallel to the two switching devices and reduce overshoot of the switched audio signals.

Each of the switching amplifiers further may include an input unit which receives an audio signal; first and second switching devices which switch and output the audio signal; a first snubber circuit which is commonly connected to the first and second switching devices and reduces overshoot of the audio signal; and a second snubber circuit which is commonly connected to the first and second switching devices, is connected in parallel to the first snubber circuit, and reduces the overshoot of the audio signal, wherein the first and second snubber circuits alternately reduce the overshoot of the audio signal.

The input unit may include a buffer which delays the audio signal and outputs the delayed audio signal; and an inverter which inverts the audio signal and outputs the inverted audio signal, wherein the first switching device is an FET having a gate to which an output port of the buffer is connected, a drain to which a first power supply unit and a first end of the first snubber circuit are commonly connected, and a source to which a second end of the first snubber circuit, a drain of the second switching device, and a first end of the second snubber circuit are commonly connected.

The second switching device may be an FET having a gate to which an output port of the inverter is connected, a drain to which the source of the first switching device, a second end of the first snubber circuit, and a first end of the second snubber circuit are commonly connected, and a source to which a second power supply unit a second end of the second snubber circuit are commonly connected.

The first snubber circuit may include a first resistor and a first capacitor which are connected in series, wherein the first resistor has a first end to which the first capacitor is connected and a second end to which a second end of the first switching device and a first end of the second switching device are commonly connected and the first capacitor has a first end to which a first power supply unit and a first end of the first switching device are commonly connected and a second end to which the first resistor is connected.

The second snubber circuit may include a second resistor and a second capacitor which are connected in series, wherein the second resistor has a first end to which the second end of the first switching device and the first end of the second switching device are commonly connected, and a second end to which the second capacitor is connected and the second capacitor has a first end to which the second resistor is connected and a second end to which the second power supply unit and the second end of the second switching device are commonly connected.

Each of the switching amplifiers may also include an LC circuit which is commonly connected to the first and second switching devices.

BRIEF DESCRIPTION OF THE DRAWINGS

The above and/or other aspects will be more apparent by describing certain exemplary embodiments with reference to the accompanying drawings, in which.

DETAILED DESCRIPTION OF EXEMPLARY EMBODIMENTS

Figure 1:
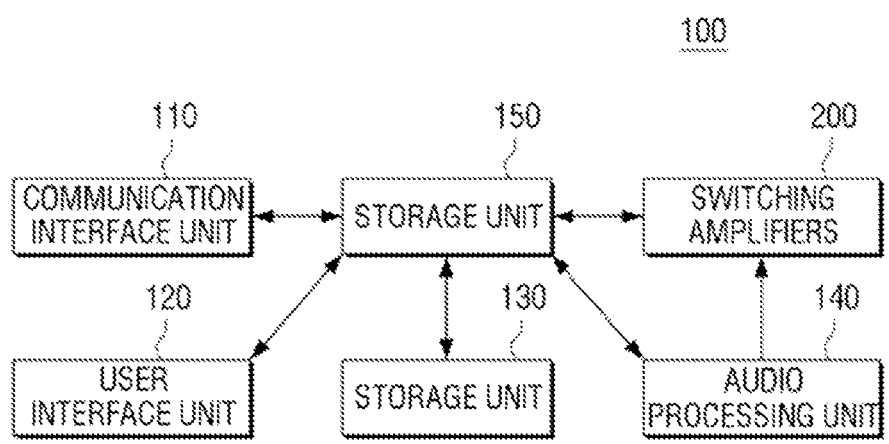
FIG. 1 is a block diagram of an audio device according to an exemplary embodiment.

Certain exemplary embodiments will now be described in greater detail with reference to the accompanying drawings.

In the following description, the same drawing reference numerals are used for the same elements even in different drawings. The matters defined in the description, such as detailed construction and elements, are provided to assist in a comprehensive understanding of the inventive concept. Thus, it is apparent that the inventive concept can be carried out without those specifically defined matters. Also, well-known functions or constructions are not described in detail since they would obscure the inventive concept with unnecessary detail.

FIG. 1 is a block diagram of an audio device according to an exemplary embodiment.

Referring to FIG. 1, an audio device 100 includes a communication interface unit 110, a user interface unit 120, a storage unit 130, an audio processing unit 140, a control unit 150, and a plurality of switching amplifiers 200. The audio device 100 may be an electronic device that is equipped with a speaker or provides audio signals to a speaker, such as a home theater system (HTS), a television (TV), a digital TV, a set-top box, a radio set, a headset, an MP3 player, a portable multimedia player (PMP), a personal computer (PC), a laptop computer, or the like.

The communication interface unit 110 may be connected to at least one external device (for example, a computer, a TV, a set-top box, a digital satellite broadcast receiver, a video tape recorder (VTR), or the like), and may receive audio content from the external device. The audio content may be analog or digital content including at least one audio signal, wherein the audio signal may be an electrical signal for a single acoustic wave channel.

The user interface unit 120 may include a plurality of function keys that allow a user to set or select various functions that are provided by the audio device 100, and may display various information provided by the audio device 100. The user interface unit 120 may be implemented as a device that serves as both an input device and an output device, such as a touch pad or the like, or as a device that is combined with an input device (such as a mouse, a keyboard, or the like) and a plurality of display devices (such as light-emitting diodes (LEDs), liquid crystal displays (LCDs), or the like). A user may adjust the volume of sound using the user interface unit 120.

The storage unit 130 may store the audio content received via the communication interface unit 110. In this case, in response to the received audio content being analog content, the storage unit 130 may convert the analog content into digital content, and may store the digital content. The storage unit 130 may be implemented as a hard disc, a nonvolatile memory, a volatile memory, or the like.

The audio processing unit 140 may perform signal processing, such as, for example, audio decoding, on input audio content or the audio content stored in the storage unit 130.

The audio processing unit 140 may separate signal-processed audio content into a plurality of audio signals. For example, in a case in which the signal-processed audio content is a stereo audio signal, the audio processing unit 140 may separate the signal-processed audio content into left- and right-audio signals. For example, in a case in which the signal-processed audio content is 2.1-channel audio content, the audio processing unit 140 may separate the signal-processed audio content into left-audio, right-audio and woofer-audio signals.

The audio processing unit 140 may transmit the audio signals obtained from the signal-processed audio content to the switching amplifiers 200. The switching amplifiers 200 may be connected to speakers (not shown). In this example, to provide an audio signal to a predetermined speaker, the audio signal may be transmitted to a switching amplifier 200 connected to the predetermined speaker. For example, in a case in which the audio processing unit 140 separates stereo audio content into left-audio and right-audio signals, the audio processing unit 140 may provide the left-audio signal to a switching amplifier 200 that is connected to a left speaker, and may provide the right-audio signal to a switching amplifier 200 that is connected to a right speaker.

The switching amplifiers 200 may switch audio signals that are provided by the audio processing unit 140, and may output the audio signals via the speakers connected thereto. More specifically, each of the switching amplifiers 200 may switch an audio signal input thereto by using two switching devices, and may provide the input audio signal to a speaker connected thereto. Each of the switching amplifiers 200 may include two switching devices and two snubber circuits that are connected to the two switching devices, respectively, in parallel, and may thus remove overshoot that may result from a switching operation performed by the two switching devices by using the two snubber circuits. The structure and the operation of the switching amplifiers 200 will be described later in detail with reference to FIG. 2.

The control unit 150 may control the communication interface unit 110, the user interface unit 120, the storage unit 130, the audio processing unit 140, and the switching amplifiers 200. For example, in response to audio content being received via the communication interface unit 110, the control unit 150 may control the audio processing unit 140 to separate the received audio content into a plurality of audio signals, and may control the switching amplifiers 200 to amplify the audio signals and to provide the amplified audio signals to the speakers connected thereto.

As described above, the audio device 100 may switch and output audio signals using the switching amplifiers 200 each having two switching devices and two snubber circuits connected to the two switching devices, respectively, in parallel. Therefore, the audio device 100 may provide a user with high-quality audio data.

In the example illustrated in FIG. 1, each of the switching amplifiers 200 may process a single channel (i.e., a single audio signal). In another non-limiting example, each of the switching amplifiers 200 may process a plurality of channels.

Figure 2:
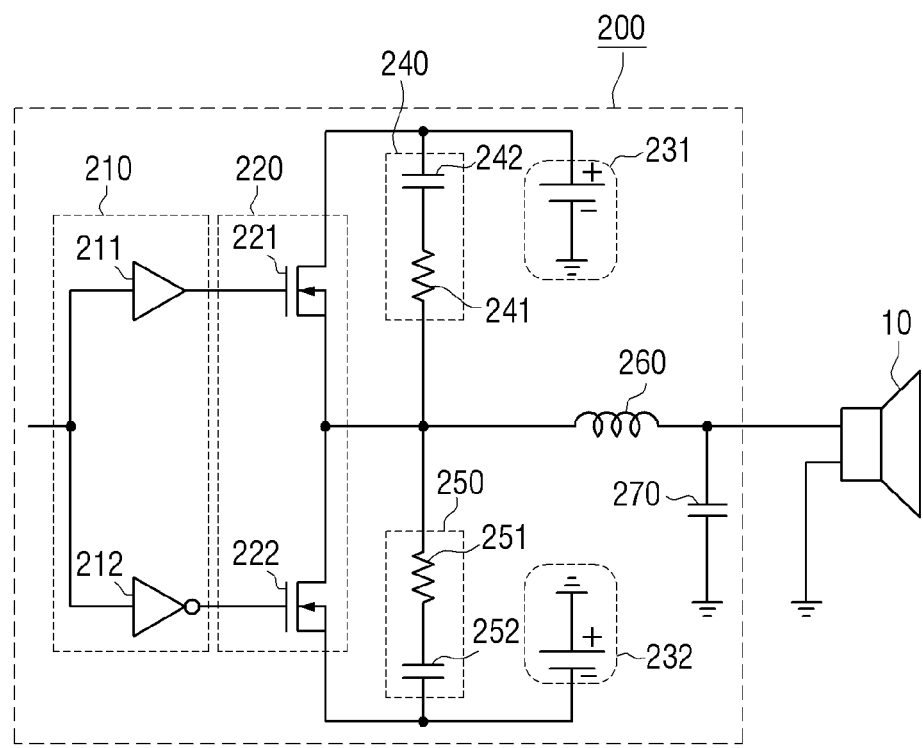
FIG. 2 is a circuit diagram of a switching amplifier illustrated in FIG. 1.

FIG. 2 is a circuit diagram of a switching amplifier 200 illustrated in FIG. 1.

Referring to FIG. 2, the switching amplifier 200 includes an input unit 210, a plurality of switching devices 220 (e.g., first and second switching devices 221 and 222), a plurality of power supply units (e.g., first and second power supply units 231 and 232), a first snubber circuit 240, a second snubber circuit 250, and LC circuits 260 and 270.

The input unit 210 may receive an input audio signal. The input unit 210 may include a buffer 211 and an inverter 212.

The buffer 211 may delay the input audio signal, and may output the delayed audio signal to the gate of the first switching device 221.

The inverter 212 may invert the input audio signal, and may output the inverted audio signal to the gate of the second switching device 222.

The first and second switching devices 221 and 222 may be connected in series to each other, and may switch and output the input audio signal.

The first switching device 221 may be a field effect transistor (FET). The gate of the first switching device 221 may be connected to the output port of the buffer 211, the drain of the first switching device 221 may be commonly connected to the first power supply unit 231 and a first end of the first snubber circuit 240, and the source of the first switching device 221 may be commonly connected to a second end of the first snubber circuit 240, a second end (for example, the drain) of the second switching device 222, and a first end of the second snubber circuit 250.

The second switching device 222 may be an FET. The gate of the second switching device 222 may be connected to the output port of the inverter 212, the drain of the second switching device 222 may be commonly connected to the second end (for example, the source) of the first switching device 221 and the first end of the second snubber circuit 250, and the source of the second switching device 222 may be commonly connected to the second power supply unit 232 and the second end of the second snubber circuit 250.

The power supply units may supply power to the first and second switching devices 221 and 222. The power supply units include the first and second power supply units 231 and 232.

The first power supply unit 231 may provide positive power to the first switching device 221.

The second power supply unit 232 may provide negative power to the second switching device 222.

The first snubber circuit 240 may be commonly connected to the first and second switching devices 221 and 222, and may reduce the overshoot of an audio signal that is output via switching. The first snubber circuit 240 may include a first resistor 241 and a first capacitor 242 that are connected in series to each other.

A first end of the first resistor 241 may be connected to the first capacitor 242, and a second end of the first resistor 241 may be commonly connected to the second end (i.e., the source) of the first switching device 221 and the first end (i.e., the drain) of the second switching device 222.

A first end of the first capacitor 242 may be commonly connected to the first power supply unit 231 and the drain of the first switching device 221, and a second end of the first capacitor 242 may be connected to the first resistor 241.

The second snubber circuit 250 may be commonly connected to the first and second switching devices 221 and 222, may be connected in parallel to the first snubber circuit 240, and may reduce the overshoot of an audio signal that is output via switching. The first and second snubber circuits 240 and 250 may alternately reduce the overshoot of an audio signal. The second snubber circuit 250 may include a second resistor 251 and a second capacitor 252 that are connected in series to each other.

A first end of the second resistor 251 may be commonly connected to the second end (i.e., the source) of the first switching device 221, the first end (i.e., the drain) of the second switching device 222, and the first resistor 241 of the first snubber circuit 240, and a second end of the second resistor 251 may be connected to the second capacitor 252.

A first end of the second capacitor 252 may be connected to the second resistor 251, and a second end of the second capacitor 252 may be commonly connected to the second power supply unit 232 and the second end (i.e., the source) of the second switching device 222.

The LC circuits 260 and 270 may be commonly connected to the first and second switching devices 221 and 222. The LC circuits 260 and 270 may include an inductor 260 and a third capacitor 270.

A first end of the inductor 260 may be commonly connected to the second end (i.e., the source) of the first switching device 221 and the first end (i.e., the drain) of the second switching device 222, and a second end of the inductor 260 may be commonly connected to a first end of a speaker 10 and a first end of the third capacitor 270.

The first end of the third capacitor 270 may be commonly connected to the second end of the inductor 260 and the first end of the speaker 10, and a second end of the third capacitor 270 may be grounded.

In the example illustrated in FIG. 2, the speaker 10 may be disposed outside the switching amplifier 200. In another example, the speaker 10 may be included in the switching amplifier 200.

In the example illustrated in FIG. 2, the first and second switching devices 221 and 222 may be implemented as FETs. In another non-limiting example, the first and second switching devices 221 and 222 may be implemented using gallium nitride GaN.

The operation of the switching amplifier 200 illustrated in FIG. 2 is described with reference to FIGS. 3 and 4.

Figure 3:
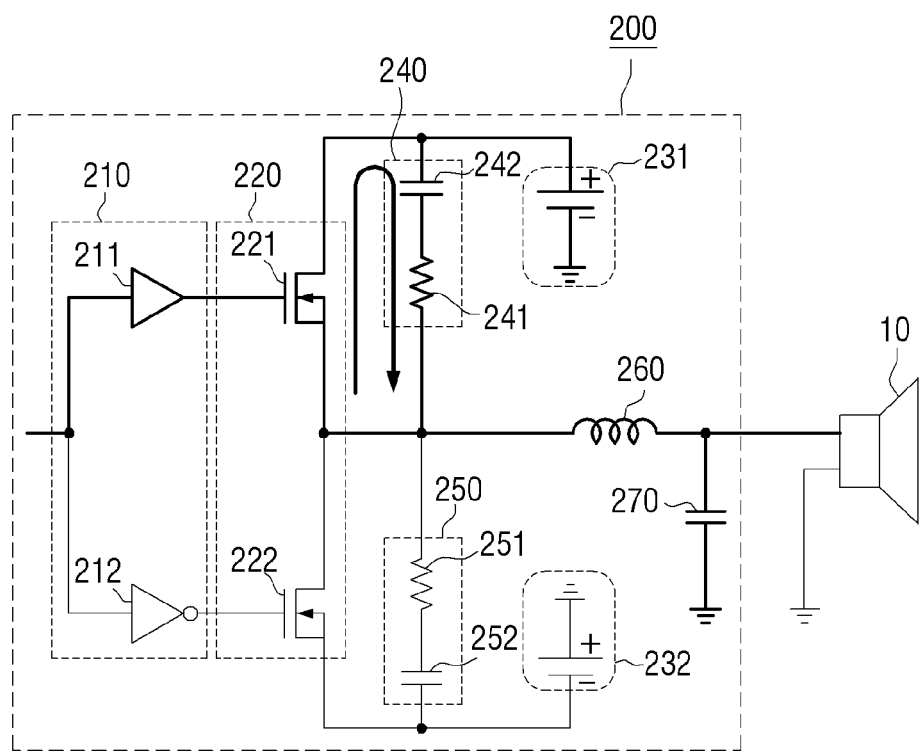
FIGS. 3 and 4 are circuit diagrams illustrating the operation of the switching amplifier illustrated in FIG. 2.

FIG. 3 illustrates an example of the operation of the switching amplifier 200 illustrated in FIG. 2 in response to the receipt of an audio signal with a level of 1.

Referring to FIG. 3, in response to the receipt of an input audio signal with a level of 1, the buffer 211 may provide the received audio signal to the first switching device 221 so that the first switching device 221 may be turned on.

The inverter 212 may provide an audio signal with a level of 0 to the second switching device 222 so that the second switching device 222 may be turned off. As a result, the first switching device 221 may temporarily suffer from overshoot, but this overshoot may be removed by the first snubber circuit 240.

Figure 4:
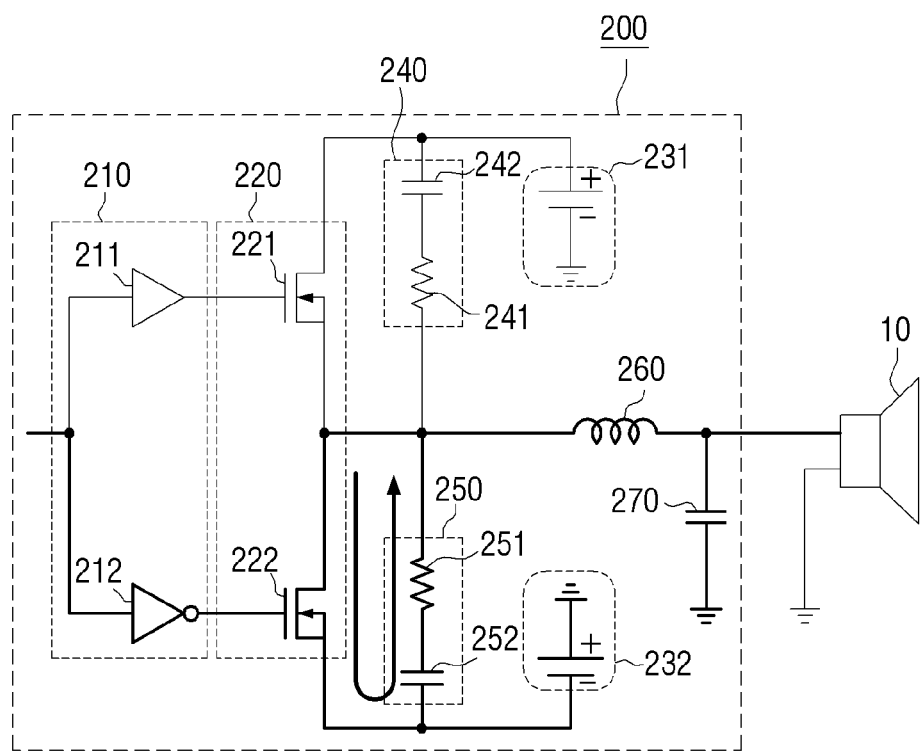

FIG. 4 illustrates an example of the operation of the switching amplifier 200 illustrated in FIG. 2 in response to the receipt of an audio signal with a level of 0.

Referring to FIG. 4, in response to the receipt of an audio signal with a level of 0, the buffer 211 may provide an audio signal with a level of 0 to the first switching device 221 so that the first switching device 221 may be turned off.

The inverter 212 may provide the received audio signal with a level of 1 to the second switching device 222 so that the second switching device 222 may be turned on. As a result, the second switching device 222 may temporarily suffer from overshoot, but this overshoot may be removed by the second snubber circuit 250.

In the examples illustrated in FIGS. 2 to 4, the first and second snubber circuits 240 and 250 may be implemented as RC snubber circuits including a resistor and a capacitor. In another non-limiting example, the first and second snubber circuits 240 and 250 may be implemented as RCD snubber circuits including a resistor, a capacitor, and a diode.

In the examples illustrated in FIGS. 2 to 4, the switching amplifier 200 may include two switching devices and two snubber circuits that are connected in parallel to the two switching devices. In another non-limiting example, the switching amplifier 200 may be configured to additionally include a snubber circuit disposed between a power source and a ground source or a snubber circuit disposed between power sources.

In the examples illustrated in FIGS. 2 to 4, the switching amplifier 200 may be implemented as a class-D amplifier, but there is no restriction to the type of amplifier that may be used as the switching amplifier 200.

Figure 5:
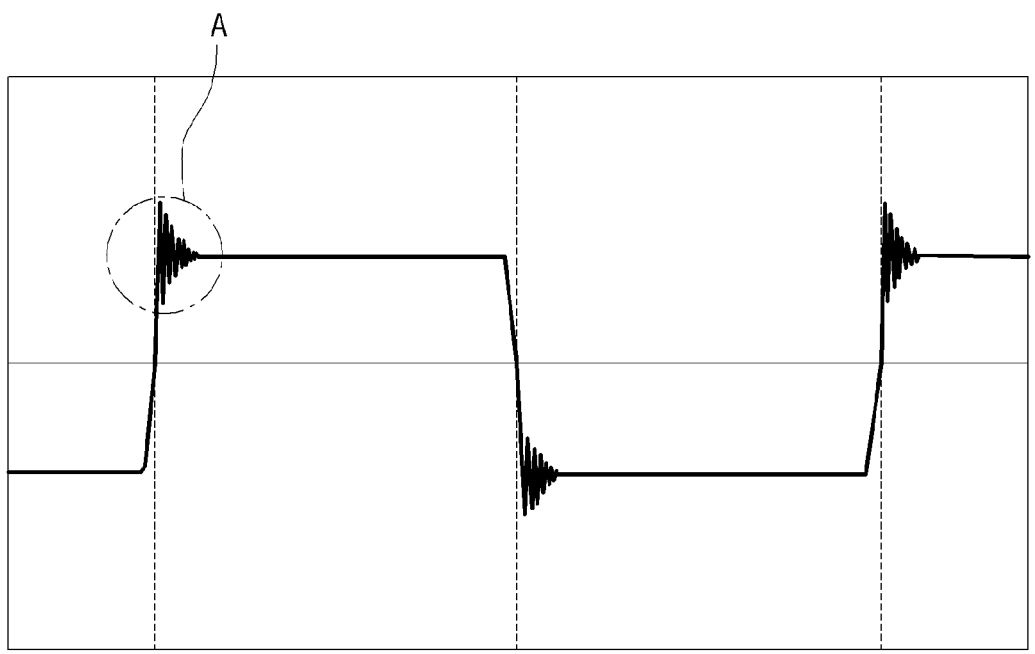
FIGS. 5 and 6 are waveform diagrams illustrating the operating characteristics of the switching amplifier illustrated in FIG. 2.
Figure 6:
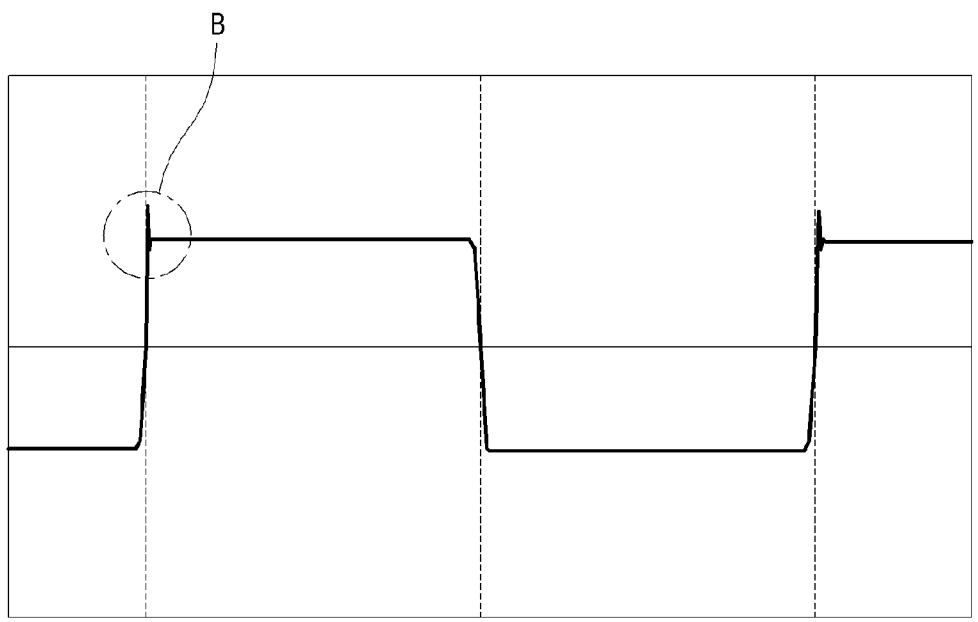

FIGS. 5 and 6 are waveform diagrams illustrating the operating characteristics of the switching amplifier 200 illustrated in FIG. 2. More specifically, FIG. 5 illustrates the waveforms of the output of a related-art switching amplifier, and FIG. 6 illustrates the waveforms of the output of the switching amplifier 200 illustrated in FIG. 2.

Referring to FIGS. 5 and 6, the switching amplifier 200 illustrated in FIG. 2 may effectively reduce overshoot, as compared to a related-art switching amplifier.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A switching amplifier comprising:
   an input unit which receives an audio signal;
   a plurality of switching devices including a first switching device and a second switching device which switch and output the audio signal;
   a first snubber circuit comprising a first resistor and a first capacitor which are connected in series to each other and which is commonly connected to the first and the second switching devices and which reduces overshoot of the audio signal that is output by the first and the second switching devices via switching; and
   a second snubber circuit comprising a second resistor and a second capacitor which are connected in series to each other and which is commonly connected to the first and the second switching devices, which is connected in parallel to the first snubber circuit and which reduces the overshoot of the audio signal,
   wherein the first and the second snubber circuits alternately reduce the overshoot of the audio signal.

2. The switching amplifier of claim 1, wherein the input unit comprises:
   a buffer which delays the audio signal and outputs the delayed audio signal; and
   an inverter which inverts the audio signal and outputs the inverted audio signal,
   wherein the first switching device is a field-effect transistor (FET) and has a first gate to which an output port of the buffer is connected, a first drain to which a first power supply unit and a first end of the first snubber circuit are commonly connected, and a first source to which a second end of the first snubber circuit, a second drain of the second switching device, and a first end of the second snubber circuit are commonly connected.

3. The switching amplifier of claim 2, wherein the second switching device is an FET having a second gate to which an output port of the inverter is connected, the second drain to which the first source of the first switching device, a second end of the first snubber circuit, and a first end of the second snubber circuit are commonly connected, and a second source to which a second power supply unit a second end of the second snubber circuit are commonly connected.

4. The switching amplifier of claim 1, wherein the first capacitor has a first end to which a first power supply unit and a first end of the first switching device are commonly connected and a second end to which the first resistor is connected, and the first resistor has a first end to which the first capacitor is connected and a second end to which a second end of the first switching device and a first end of the second switching device are commonly connected.

5. The switching amplifier of claim 4, wherein the second resistor has a first end to which the second end of the first switching device and the first end of the second switching device are commonly connected, and a second end to which the second capacitor is connected, and the second capacitor has a first end to which the second resistor is connected and a second end to which the second power supply unit and a second end of the second switching device are commonly connected.

6. The switching amplifier of claim 1, further comprising:
   an LC circuit which is commonly connected to the first and second switching devices.

7. An audio device comprising:
   a communication interface unit which receives audio content;
   an audio processing unit which separates the audio content into a plurality of audio signals; and
   a plurality of switching amplifiers which switch the audio signals using two switching devices connected thereto in series and provide the switched audio signals to a plurality of speakers,
   wherein each of the plurality of switching amplifiers comprises two snubber circuits each comprising a respective resistor and capacitor which are connected in series to each other and which are connected in parallel to the two switching devices and reduce overshoot of the switched audio signals.

8. The audio device of claim 7, wherein each of the plurality of switching amplifiers further comprises:
   an input unit which receives an audio signal;

a plurality of switching devices including a first switching device and a second switching device which switch and output the audio signal;

a first snubber circuit which is commonly connected to the first and the second switching devices and which reduces overshoot of the audio signal; and a second snubber circuit which is commonly connected to the first and the second switching devices, which is connected in parallel to the first snubber circuit, and which reduces the overshoot of the audio signal, wherein the first and the second snubber circuits alternately reduce the overshoot of the audio signal.

9. The audio device of claim 8, wherein the input unit comprises:

a buffer which delays the audio signal and outputs the delayed audio signal; and an inverter which inverts the audio signal and outputs the inverted audio signal, wherein the first switching device is an FET having a first gate to which an output port of the buffer is connected, a first drain to which a first power supply unit and a first end of the first snubber circuit are commonly connected, and a first source to which a second end of the first snubber circuit, a second drain of the second switching device, and a first end of the second snubber circuit are commonly connected.

10. The audio device of claim 9, wherein the second switching device is an FET having a second gate to which an output port of the inverter is connected, the second drain to which the first source of the first switching device, a second end of the first snubber circuit, and a first end of the second snubber circuit are commonly connected, and a second source to which a second power supply unit a second end of the second snubber circuit are commonly connected.

11. The audio device of claim 8, wherein the respective resistor and capacitor of the first snubber circuit comprises a first resistor and a first capacitor which are connected in series, wherein the first capacitor has a first end to which a first power supply unit and a first end of the first switching device are commonly connected and a second end to which the first resistor is connected, and the first resistor has a first end to which the first capacitor is connected and a second end to which a second end of the first switching device and a first end of the second switching device are commonly connected.

12. The audio device of claim 11, wherein respective resistor and capacitor of the second snubber circuit comprises a second resistor and a second capacitor which are connected in series, wherein the second resistor has a first end to which the second end of the first switching device and the first end of the second switching device are commonly connected, and a second end to which the second capacitor is connected, and the second capacitor has a first end to which the second resistor is connected and a second end to which the second power supply unit and a second end of the second switching device are commonly connected.

13. The audio device of claim 8, wherein each of the switching amplifiers further comprises an LC circuit which is commonly connected to the first and the second switching devices.

14. The audio device of claim 1, wherein, if the audio signal is received by the input unit at a high level, the first snubber circuit reduces the overshoot of the audio signal, and, if the audio signal is received by the input unit at a low level, the second snubber circuit reduces the overshoot of the audio signal.

15. The switching amplifier of claim 3, wherein the first snubber circuit comprises a first resistor and a first capacitor which are connected in series, wherein the first capacitor has a first end to which a first power supply unit and a first end of the first switching device are commonly connected and a second end to which the first resistor is connected, and the first resistor has a first end to which the first capacitor is connected and a second end to which a second end of the first switching device and a first end of the second switching device are commonly connected.

16. The switching amplifier of claim 15, wherein the second snubber circuit comprises a second resistor and a second capacitor which are connected in series, wherein the second resistor has a first end to which the second end of the first switching device and the first end of the second switching device are commonly connected, and a second end to which the second capacitor is connected, and the second capacitor has a first end to which the second resistor is connected and a second end to which the second power supply unit and a second end of the second switching device are commonly connected.

* * * * *